United States Patent [19]
Takahashi et al.

[11] Patent Number: 6,119,917
[45] Date of Patent: Sep. 19, 2000

[54] WIRE BONDING APPARATUS AND BONDING LOAD CORRECTION METHOD FOR THE SAME

[75] Inventors: Kuniyuki Takahashi, Musashimurayama; Hijiri Hayashi, Nakano-Ku, both of Japan

[73] Assignee: Kabushiki Kaisha Shinkawa, Tokyo, Japan

[21] Appl. No.: 09/054,232

[22] Filed: Apr. 2, 1998

[30] Foreign Application Priority Data

Apr. 2, 1997 [JP] Japan ................................ 9-099733

[51] Int. Cl.[7] .......................... B23K 31/02; B23Q 15/22; B23Q 16/00
[52] U.S. Cl. ............................... 228/102; 228/4.5; 228/9; 228/180.5
[58] Field of Search ........................... 228/102, 9, 180.5, 228/4.5, 110.1, 1.1

[56] References Cited

U.S. PATENT DOCUMENTS

| | | | |
|---|---|---|---|
| 4,266,710 | 5/1981 | Bilane et al. | 228/4.5 |
| 4,597,519 | 7/1986 | Kurtz et al. | 228/102 |
| 5,011,061 | 4/1991 | Funatsu | 228/1.1 |
| 5,060,841 | 10/1991 | Oshima et al. | 228/102 |
| 5,207,370 | 5/1993 | Mochida et al. | 228/102 |
| 5,316,201 | 5/1994 | Sugiura | 228/4.5 |
| 5,443,200 | 8/1995 | Arikado | 228/102 |
| 5,586,713 | 12/1996 | Arita et al. | 228/102 |
| 5,645,210 | 7/1997 | Toner et al. | 228/102 |
| 5,816,477 | 10/1998 | Shimizu | 228/102 |

FOREIGN PATENT DOCUMENTS

| | | |
|---|---|---|
| 58-184734 | 10/1983 | Japan . |
| 6-29343 | 2/1994 | Japan . |
| 6-18222 | 3/1994 | Japan . |
| 6-80697 | 10/1994 | Japan . |

Primary Examiner—Gregory Mills
Assistant Examiner—Kiley Stoner
Attorney, Agent, or Firm—Koda & Androlia

[57] ABSTRACT

A bonding apparatus for manufacturing, for instance, a semiconductor device including a computer system which calculates a limit value of a driving current that flows to a linear motor controlling a bonding arm, and the computer system including a memory which stores correction current values that are used to correct the driving force of a plate spring at various height positions of the bonding arm, and limit values of the driving current according to a bonding load.

2 Claims, 6 Drawing Sheets

WIRE BONDING APPARATUS AND BONDING LOAD CORRECTION METHOD FOR THE SAME

BACKGROUND OF THE INVENTION

1. Field of the Invention

The present invention relates to a wire bonding apparatus in which a bonding arm is supported via a plate spring in a manner of vertically swingable and a bonding load correction method for such a wire bonding apparatus.

2. Prior Art

Figure 4:
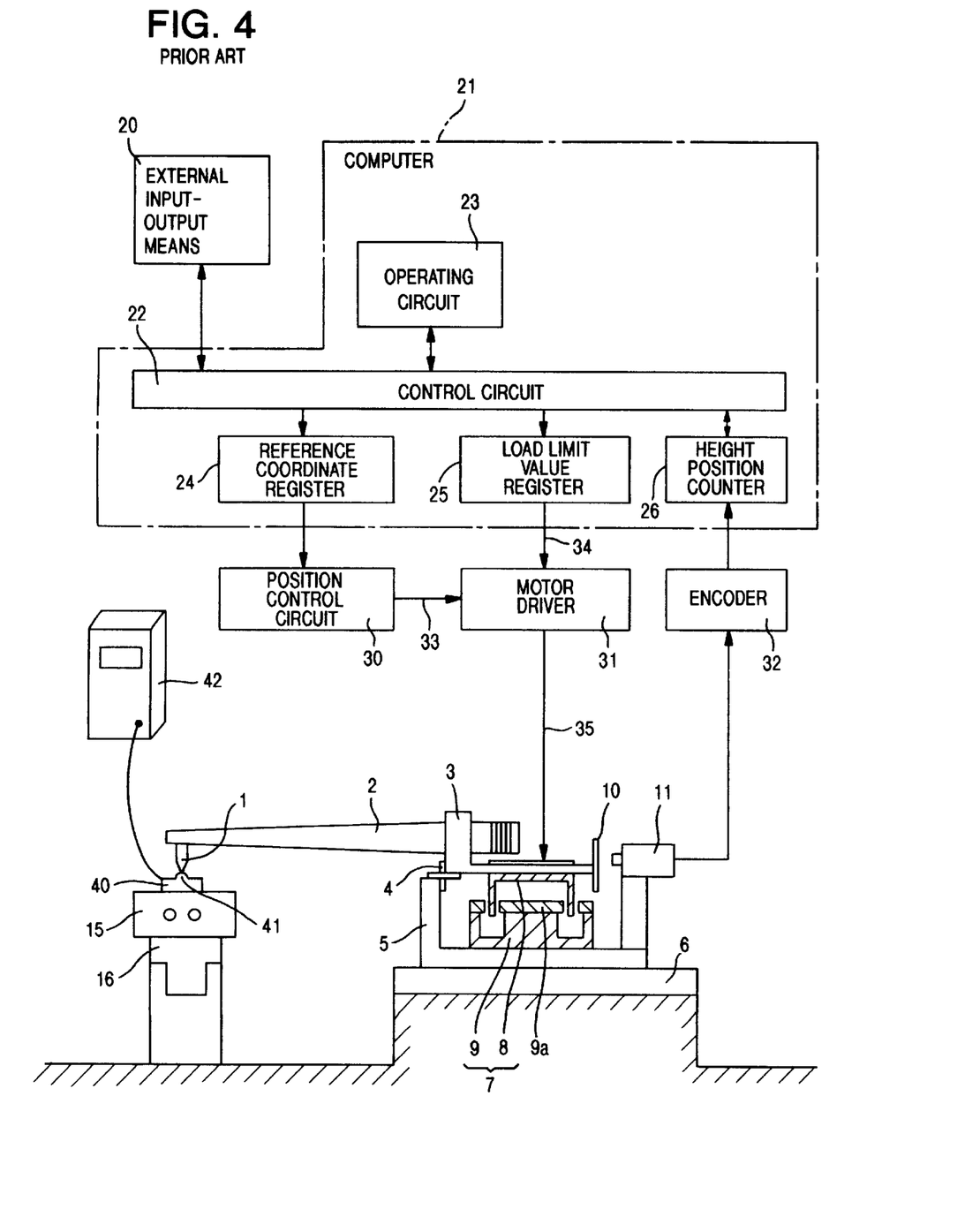
FIG. 4 is an explanatory diagram illustrating a conventional wire bonding apparatus.

A wire bonding apparatus in which the bonding arm is supported via a plate spring so that the bonding arm can be caused to freely swing upward and downward is shown in FIG. 4.

The bonding arm 2 of this bonding apparatus has a bonding tool 1 at one end thereof and is fastened to one end of a supporting frame 3. The supporting frame 3 is attached to a moving table 5 via a plate spring 4 which is assembled in the form of a cross, so that the supporting frame 3 is swingable upward and downward as shown by an arrow V, and a moving table 5 is mounted on an XY table 6. The coil 8 of a linear motor 7 is fastened to another end of the supporting frame 3, and the magnet 9 of this linear motor 7 is fastened to the moving table 5. A linear scale 10 is mounted to the rear end (right-side end in FIG. 4) of the supporting frame 3, and a position sensor 11 is fastened to the moving table 5 so as to face this linear scale 10. The wire bonding apparatus further includes a heating block 15 which heats a workpiece (not shown), and this heating block 15 is raised and lowered by a raising-and-lowering mechanism 16.

Examples of a wire bonding apparatus of this type are described in Japanese Patent Application Pre-Examination Publication (Kokai) Nos. S58-184734 and H6-29343 and Japanese Examined Patent Application Publication (Kokoku) No. H6-80697.

With the structure described above, the supporting frame 3 and bonding arm 2 are caused to swing in the direction of arrow V about the plate spring 4 by the linear motor 7, and the bonding tool 1 is thus moved up and down. Furthermore, the moving table 5, supporting frame 3, bonding arm 2 and bonding tool I are moved in the horizontal (or X and Y) by the XY table 6. By way of a combination of the vertical movement and horizontal movement of the bonding tool 1, a wire (not shown) passing through the bonding tool 1 is connected between a first bonding point and a second bonding point on the workpiece (not shown). In other words, a ball formed at the tip end of the wire is bonded to the first bonding point, and the other portion of the wire is bonded to the second bonding point. During bonding of the wire to the first bonding point and second bonding point, a load or a bonding load is applied by the linear motor 7 so that the ball or wire is pressed against the bonding point on the workpiece by the bonding tool 1.

Next, the operation system for the above bonding apparatus and the control configuration of the linear motor 7 will be described. The operation system substantially comprises an external input-output means 20 and a computer 21.

First, the external input-output means 20 performs input-output of various types of information (required for the operation of the apparatus) with respect to the computer 21. This may be accomplished by manual operation or by operation based on on-line communication with external devices.

Second, the computer 21 comprises a control circuit 22, an operating circuit 23, a reference coordinate register 24, a load limit value register 25 and a height position counter 26. The control circuit 22 controls the external input-output means 20, operating circuit 23, reference coordinate register 24, load limit value register 25 and height position counter 26.

In the reference coordinate register 24, the height position of the bonding arm 2 is stored. The value of the height position is inputted into a position control circuit 30 as one position command. When the value is inputted, the position control circuit 30 compares a previous position command and a new position command and generates an amount of movement of the bonding tool from the difference between the two position commands. This amount of movement is transmitted to a motor driver 31 as a driving signal 33.

In the load limit value register 25, a value which indicates the upper limit (value) of the bonding load is stored, the load limit value register 25 transmits such a value to the motor driver 31 as limit information 34. The motor driver 31 generates electric power which is used to move the bonding tool 1 to the designated height position in accordance with the driving signal 33 and at the same time acts so as to limit the electric power in accordance with the limit information 34 so that the upper limit value of the bonding load is not exceeded. Generally, electric power is the product of voltage and current; therefore, actual control of the linear motor 7 can be accomplished by controlling either the voltage or current, or both. Accordingly, the following explanation is given which describes the case where the driving current 35 (and not voltage) that flows through the linear motor 7 is limited. The circuit described in Japanese Examined Patent Application Publication (Kokoku) No. H6-18222 may be cited as an example of the circuit that controls the driving current. When the driving current 35 generated by the motor driver 31 is applied to the coil 8 of the linear motor 7, a driving force is generated; and as a result of this driving force, the supporting frame 3, bonding arm 2 and bonding tool 1 are caused to swing about the plate spring 4.

Furthermore, the height position counter 26 of the computer 21 counts signals from an encoder 32 which converts signals from the position sensor 11 into a signal format which is suitable for being inputted into the computer 21 and generates an actual height position on the linear scale 10. The computer 21 is provided beforehand with the ratio of the amount of movement of the bonding tool 1 in the vertical direction to the amount of movement of the linear scale 10 in the vertical direction, and a quantization coefficient (one unit being several microns). Accordingly, the actual height position of the bonding tool 1 is determined by calculations performed (on the basis of the above-described value) by the operating circuit 23 on the value indicated by the height position counter 26.

A bonding load calibration method within the bonding apparatus described above will be described.

First, a load cell 40 is placed on the heating block 15 so that the projecting part 41 (detection part) of the load cell 40 is positioned directly beneath the tip end portion of the bonding tool 1. This load cell 40 is connected to a load gauge 42, so that the load applied to the load cell 40 is constantly displayed by the load gauge 42.

Next, the raising-and-lowering mechanism 16 is operated so as to raise and lower the heating block 15 and load cell 40, and the bonding arm 2 is adjusted to a horizontal position. The reason for the bonding arm 2 to be adjusted to a horizontal position is that since the bonding arm 2 and bonding tool 1 swing about the plate spring 4, when the bonding tool 1 contacts the bonding point, it is desirable that the bonding tool 1 be in a vertical state, in other words, the bonding arm 2 is in a horizontal state.

When the bonding arm 2 has thus been adjusted to a horizontal position, a command is sent to the computer 21 using the external input-output means 20 so that the bonding arm 2 is placed in a horizontal position. As a result of this command, the control circuit 22 sends control information for this purpose (horizontal positioning) to the position control circuit 30 via the reference coordinate register 24; and in addition, the control circuit 22 sends limit information 34 which is used to limit the driving current 35 to the motor driver 31. Furthermore, the position control circuit 30 sends a driving signal 33 which is used to generate a driving current 35 to the motor driver 31. On the basis of this driving signal 33, the motor driver 31 generates a driving current 35 of the specified polarity and magnitude and outputs this driving current 35 to the coil 8. However, in cases where the driving current 35 exceeds the limit value specified by the computer 21, the magnitude of the driving current 35 is limited to the limit value.

Afterward, instructions concerning the movement of the bonding arm 2 are sent out from the computer 21 in the manner described above.

Next, when the bonding load (for instance 20 g) is set via the external input-output means 20, this load is applied to the load cell 40 as a result of the above-described operation. In this case, since the actual bonding load value is displayed by the load gauge 42 which is connected to the load cell 40, it is necessary to adjust the driving current 35 so that this value is equal to the set bonding load. The correspondence between the limit information 34 specified by the computer 21 and the value of the actually limited bonding load is thus altered by manual operation of the external input-output means 20. When the set bonding load agrees with the actual value of the bonding load displayed by the load gauge 42, the bonding load is set at a different value (for instance, 200 g), and then the above-described operation is repeated. In this way, the error between the set bonding load and the actual bonding load is minimized.

Figure 5:
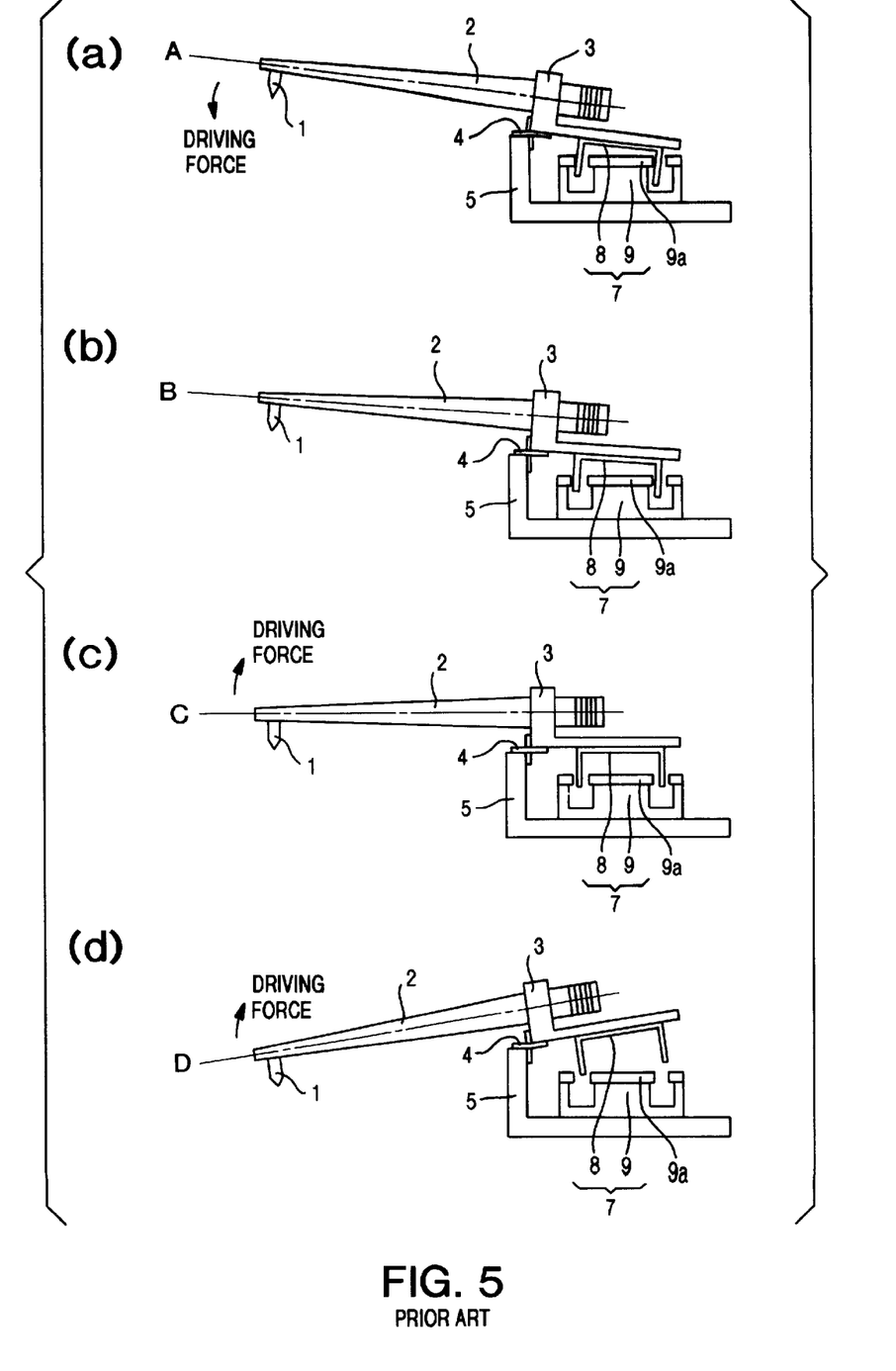
FIGS. 5 (5(a), 5(b), 5(c), 5(d)) shows diagrams illustrating the relationship between the coil and magnet of the linear motor according to the height position of the bonding arm.

In the system wherein the supporting frame 3 is supported by a plate spring 4 so as to swing upward and downward as described above, when no driving current 35 flows through the coil 8 or when no driving force is generated in the linear motor 7, the bonding arm 2 stops at the equilibrium position B as shown in FIG. 5(*b*) which is between the driving force of the plate spring 4 and the weight balance of the bonding tool 1, bonding arm 2, supporting frame 3, coil 8 and linear scale 10, etc. supported by the plate spring 4. The driving force of the plate spring 4 in this case acts in a direction which causes the bonding arm 2 to return to the equilibrium position B.

Figure 6:
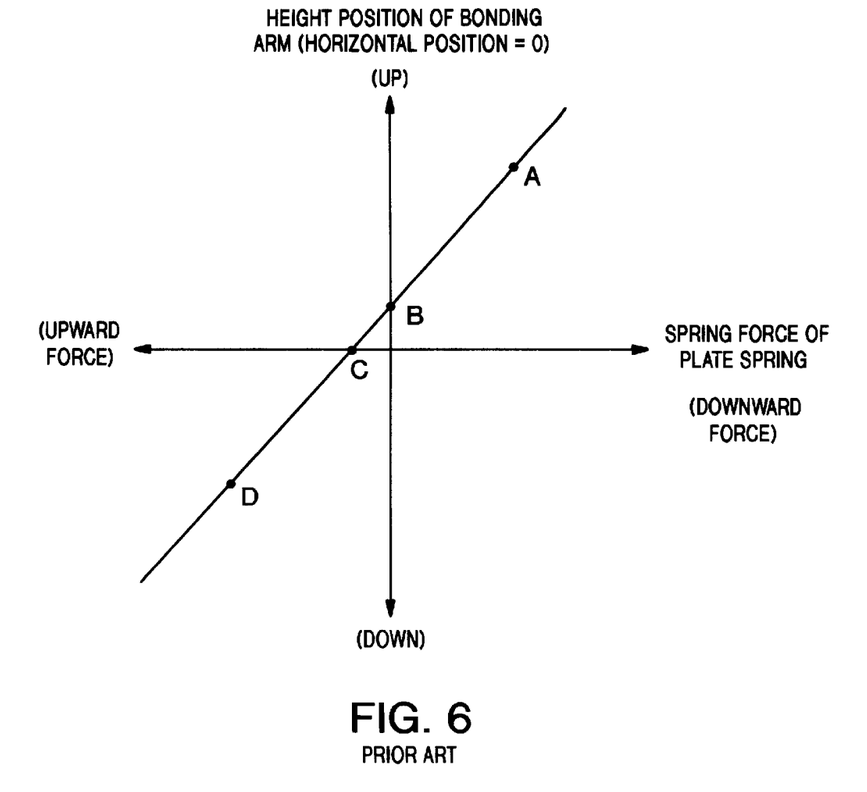
FIG. 6 is a graph showing the relationship between the height position of the bonding arm and the spring load of the plate spring.

More specifically, when the bonding arm 2 is in a position A which is higher than the equilibrium position B as shown in FIG. 5(*a*), a driving force which pushes the bonding arm 2 downward toward the equilibrium position B is generated. On the other hand, when the bonding arm 2 is in a position C or D lower than the equilibrium position B, as shown in FIG. 5(*c*) or 5(*d*), then a driving force which pushes the bonding arm upward toward the equilibrium position B is generated. The variation in the driving force of the plate spring 4 is shown in FIG. 6. The equilibrium position B varies according to the mechanism and model of the wire bonding apparatus; therefore, the bonding arm 2 in the equilibrium position B is not necessarily to a horizontal position as shown in FIG. 5(*c*).

In the equilibrium position B, the driving force of the plate spring 4 is zero. However, as the bonding arm 2 is displaced toward a higher position A, the downward-pulling force by the plate spring 4 increases, so that the driving force of the plate spring 4 is added to the original bonding load. Accordingly, the actual bonding load is increased by a corresponding amount. On the other hand, as the bonding arm 2 is displaced toward the lower positions C and D, then the upward-pulling force by the plate spring 4 increases, so that this force cancels the original bonding load. Accordingly, the actual bonding load is decreased by a corresponding amount.

As seen from the above, the prior art system has a problem. In other words, as the height position of the bonding arm 2 is apart from the equilibrium position B determined by the plate spring 4, error between the set bonding load and the actual bonding load increases.

Furthermore, in the conventional bonding load calibration method, the set bonding load is merely adjusted with the height position of the bonding point set at the horizontal position C of the bonding arm 2; and absolutely no consideration is given to the relationship between the driving force of the plate spring 4 and the weight balance of the bonding tool 1, bonding arm 2, supporting frame 3, coil 8 and linear scale 10, etc., supported by the plate spring 4. In the mean time, the height of the bonding points of the workpieces to be bonded varies according to the type of workpiece involved. In some cases, furthermore, the first and second bonding points have different heights. Accordingly, when bonding is performed at a position other than the equilibrium position B, a driving force is generated in the plate spring 4, and this driving force affects the bonding load, so that the actual bonding load differs from the set bonding load.

Figure 7:
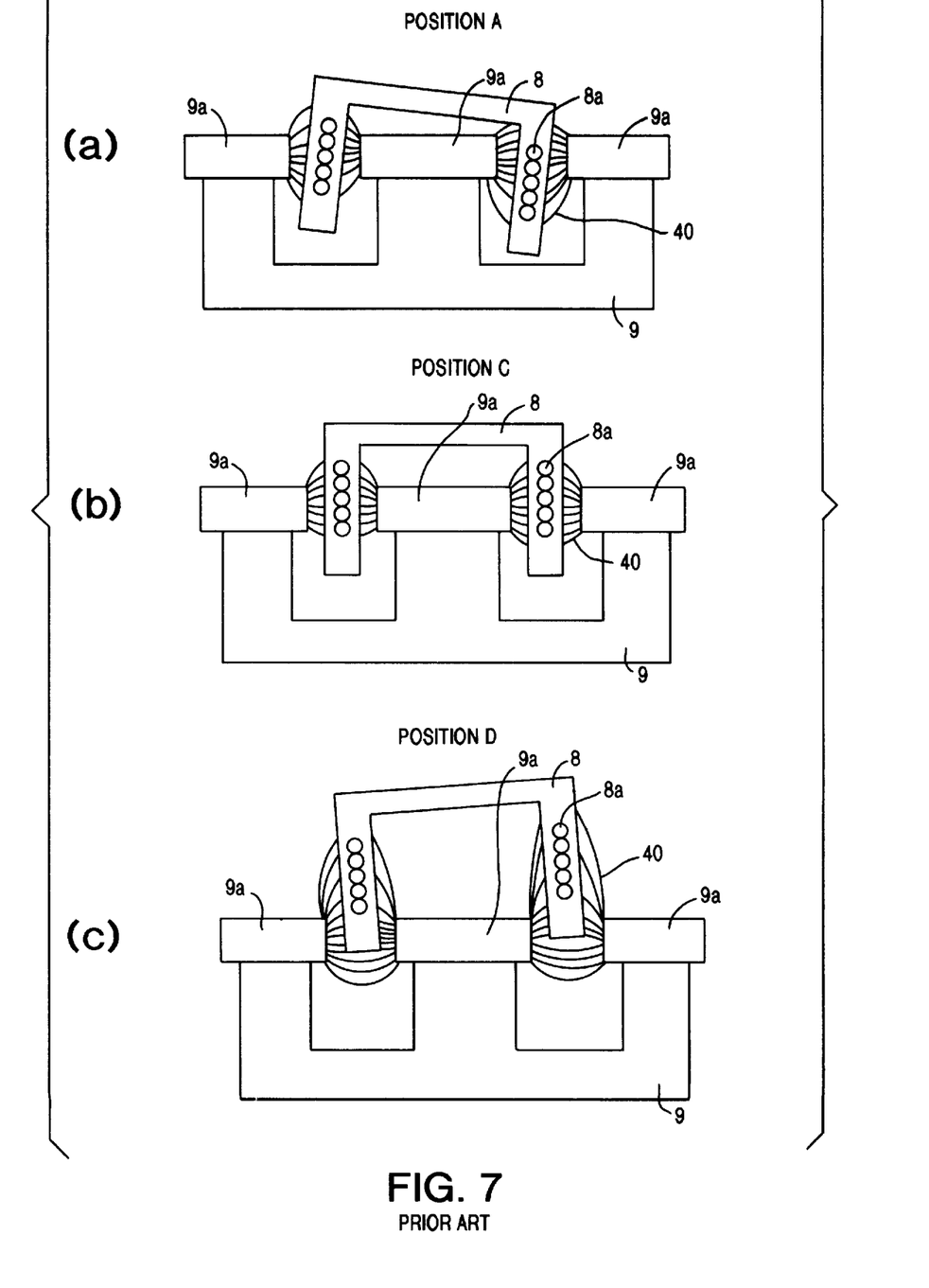
FIGS. 7 (7(a), 7(b), 7(c)) shows explanatory diagrams illustrating the magnetic flux density relationship when the coil is in various positions.
Figure 8:
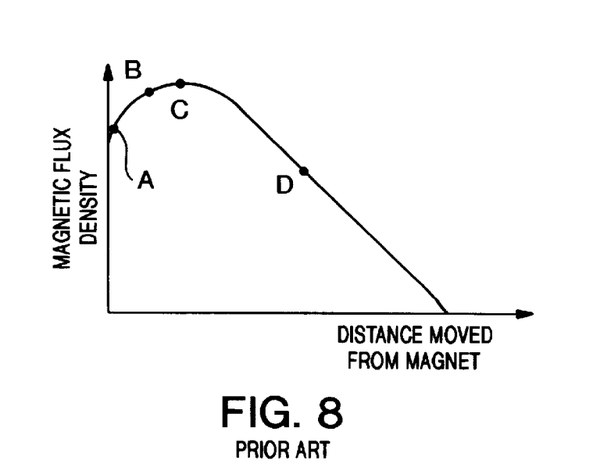
FIG. 8 is a graph showing the relationship between the magnetic flux received by the coil and the distance of the coil from the magnet.

Meanwhile, the height position and inclination of the coil 8 vary according to the position A, B, C or D of the bonding arm 2; and therefore, the magnetic flux density received by the coil 8 also varies. This will be described with reference to FIGS. 5, 7 and 8. FIGS. 7 and 8 show the relationship of the flux density with respect to the positional relationship between the coil 8 and the magnet 9 when the coil 8 is located in various positions. FIG. 7(*a*) shows the magnetic flux 40 when the bonding arm 2 is in position A of FIG. 5(*a*), FIG. 7(*b*) shows the magnetic flux 40 when the bonding arm 2 is in position C of FIG. 5(*c*), and FIG. 7(*c*) shows the magnetic flux 40 when the bonding arm 2 is in position D of FIG. 5(*d*). When the bonding arm 2 is in position B as in FIG. 5(*b*), then the magnetic flux is formed in an intermediate form between FIGS. 7(*a*) and 7(*b*).

In these FIGS. 7(*a*) through 7(*c*), the magnetic flux density increases as the coil windings 8*a* of the coil 8 approach the head part 9*a* of the magnet 9, so that the influence of the magnetic flux 40 received by the coil 8 becomes stronger. In other words, the magnetic flux density is highest at the position C in FIG. 7(*b*), and a strong driving force is generated accordingly. However, when the coil 8 is away from the magnet 9, or inclined at an angle, as shown in FIG. 7(*a*) or 7(*c*), then the magnetic flux density decreases compared to that at position C, and the driving force drops correspondingly. Accordingly, in order to obtain the same driving force at all positions, it is necessary to increase the electric current in response to any decrease in the magnetic flux density by an amount which compensates for this decrease.

However, in the prior art described above, absolutely no consideration is given to variations in the magnetic flux density received by the coil 8.

SUMMARY OF THE INVENTION

Accordingly, the object of the present invention is to provide a bonding apparatus and a bonding load correction method for the bonding apparatus, which make it possible to obtain an actual bonding load that is equal to the set bonding load, regardless of the height position of the bonding point.

The above object is accomplished by a unique structure for a wire bonding apparatus that includes: a bonding arm which has a bonding tool at one end thereof and is supported via a plate spring so as to swing upward and downward, a linear motor which drives this bonding arm in a swinging motion, a position sensor which detects the position of the bonding arm in a vertical direction, a computer which processes signals from the position sensor and calculates the height position of the bonding arm and the limit value of the driving current flowing through the linear motor, a position control circuit which controls the maintenance of the height position or the movement of the bonding arm in accordance with commands from the computer, a motor driver which generates the driving current in accordance with commands from the position control circuit and which has a current limiter function that limits the amount of the driving current in accordance with commands from the computer, and an external input-output means which inputs instructions into the computer and outputs results from the computer, and wherein the computer further includes a memory which stores a correction current value that corrects the driving force of the plate spring at the height position of the bonding arm, and the limit value of the driving current according to the bonding load.

In addition, the above object is also accomplished by a unique method for a wire bonding apparatus that includes: a bonding arm which has a bonding tool at one end thereof and is supported via plate spring so as to swing upward and downward, a linear motor which drives this bonding arm in a swinging motion, a position sensor which detects the position of the bonding arm in a vertical direction, a computer which processes signals from the position sensor and calculates the height position of the bonding arm and the limit value of the driving current flowing through the linear motor, a position control circuit which controls the maintenance of the height position or the movement of the bonding arm in accordance with commands from the computer, a motor driver which generates the driving current in accordance with commands from the position control circuit and which has a current limiter function that limits the amount of the driving current in accordance with commands from the computer, and an external input-output means which inputs instructions into the computer and outputs results from the computer, and wherein the driving force of the plate spring is determined from the relationship between the amount of current flowing through the linear motor and the height position of the bonding arm, and the current flowing through the linear motor is controlled so as to correct this driving force.

DETAILED DESCRIPTION OF THE INVENTION

An embodiment of the present invention will be described with reference to FIGS. 1 through 3. Constituting elements which are the same as in FIGS. 4 and 5 or which correspond to those in FIGS. 4 and 5 are labeled with the same symbols, and a detailed description of such parts is omitted.

Figure 1:
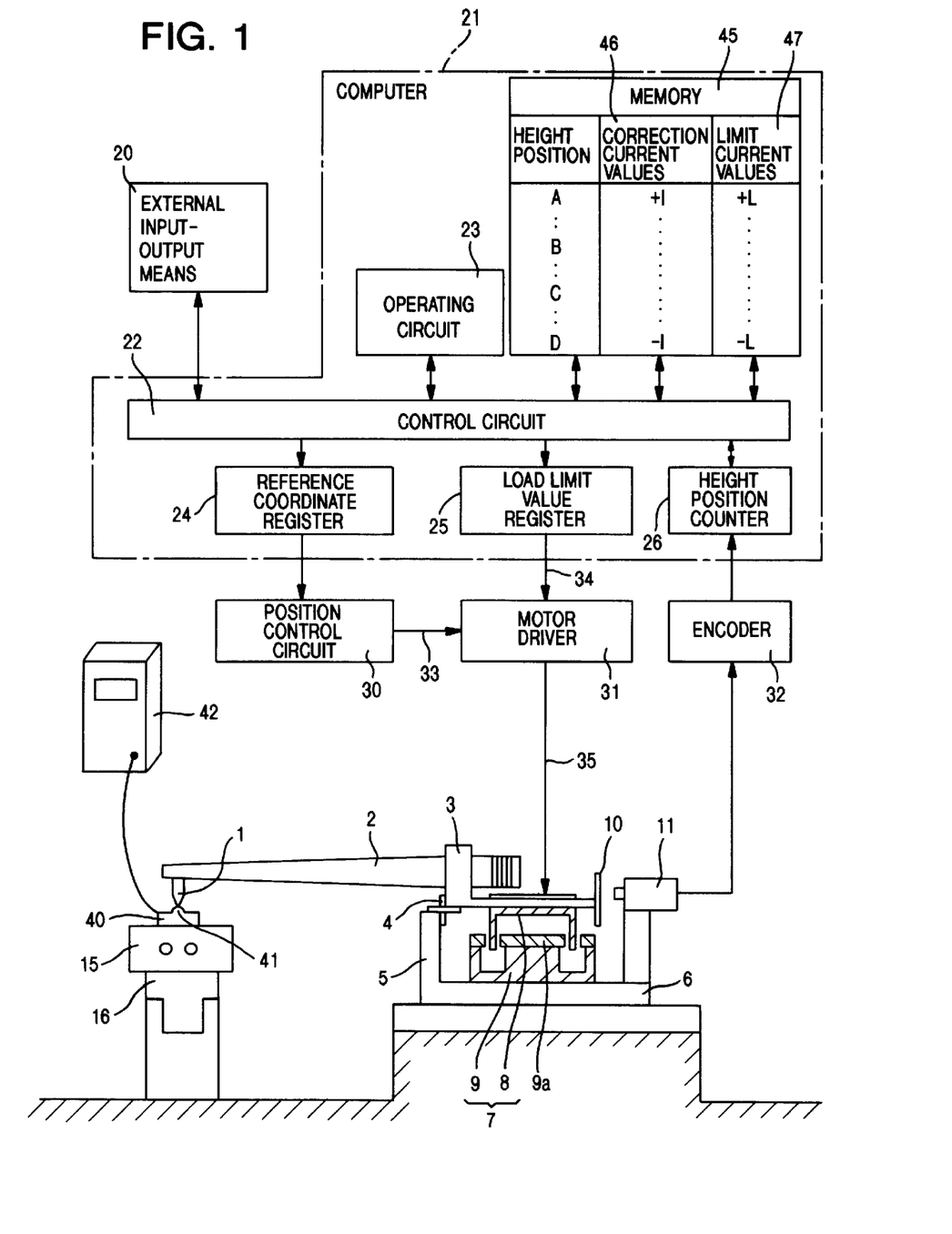
FIG. 1 is an explanatory diagram which illustrates one embodiment of the wire bonding apparatus of the present invention.

As shown in FIG. 1, in the present invention, the computer 21 is provided with a memory 45 in addition to a control circuit 22, an operating circuit 23, a reference coordinate register 24, a load limit value register 25 and a height position counter 26; and in this memory 45, correction current values 46, which are necessary in order to correct the variation in the driving force of the plate spring 4 and the magnetic flux density received by the coil 8 of the linear motor 7 according to the respective positions A . . . B . . . C . . . D of the bonding arm 2, and limit current values 47 of the driving current 35 are stored.

Below, a method for setting the correction current values 46 and the limit current values 47 will be described using FIGS. 2 and 3 with reference to FIG. 5.

The relationship between the position of the coil 8 and the driving current 35 in the so-called "no-load state", in which the load consists only of the spring load of the plate spring 4, and the actual bonding load is zero, is investigated. In the procedure used in this case, first, the bonding arm 2 is moved to position A shown in FIG. 5(a), and is stopped in this position. The driving force of the plate spring 4 in this case acts so as to push the bonding arm 2 downward, the driving force generated by the coil 8 being an equal force which cancels the driving force of the plate spring 4. The limit value of the bonding load (i. e., the value stored in the load limit value register 25) is set at a value which has a margin obtained by raising the upper limit value to some extent so that a driving current 35 which can cancel the driving force of the plate spring 4 is caused to flow to the coil 8. Next, the limit value (absolute value) of the driving current 35 is gradually lowered. When this is done, the driving current 35 is reduced so that at a certain point the driving force generated by the coil 8 falls below the driving force of the plate spring 4, and the height position of the bonding arm 2 drops. Accordingly, the height position immediately prior to this drop and the limit value of the driving current 35 are stored in the memory 45. The limit value stored by means of this procedure is a value which corresponds to the amount of driving current 35 that generates a driving force sufficient to cancel the driving force of the plate spring 4.

Next, the bonding arm 2 is moved to position D shown in FIG. 5(d) and is stopped in this position. Then, in the same manner as described above, the limit value of the driving current 35 is gradually lowered. When this is done, the height position of the bonding arm 2 rises at a certain point; therefore, the height position immediately prior to this rise and the limit value of the driving current 35 in this case are stored in the memory 45.

The above-described investigation is performed for a plurality of positions, and values for the regions between these positions are determined by a linear interpolation performed by the operating circuit 23. This relationship is shown in FIG. 2. Accordingly, the basic amount of current required in order to cancel the driving force of the plate spring 4 can be determined from the set bonding height position. The amount of current obtained by adding the current corresponding to the set bonding load (actual load current) to the above-described basic amount of current is the amount of driving current 35 that is actually applied to the coil 8. In other words, since the driving force of the plate spring 4 with respect to the set height position is canceled out, a bonding load equal to the set value is obtained regardless of the height position. Furthermore, since there are no calibration differences due to individual human factors or differences between individual pieces of equipment, a reliable calibration can be performed. Here, points A, B, C and D indicate the respective positions shown in FIGS. 5(a), 5(b), 5(c) and 5(d).

Figure 2:
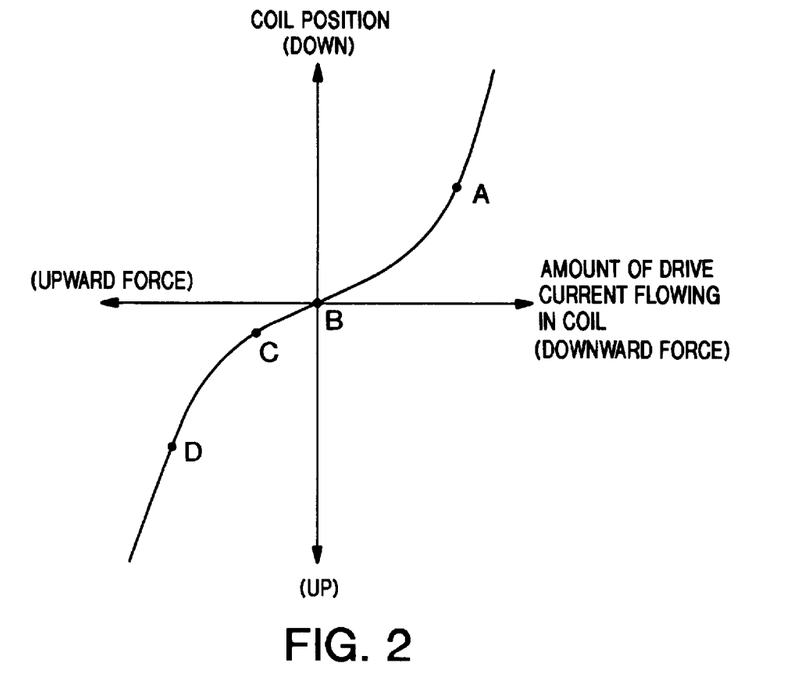
FIG. 2 is a graph showing the relationship between the height position of the coil and the driving current in a no-load state.
Figure 3:
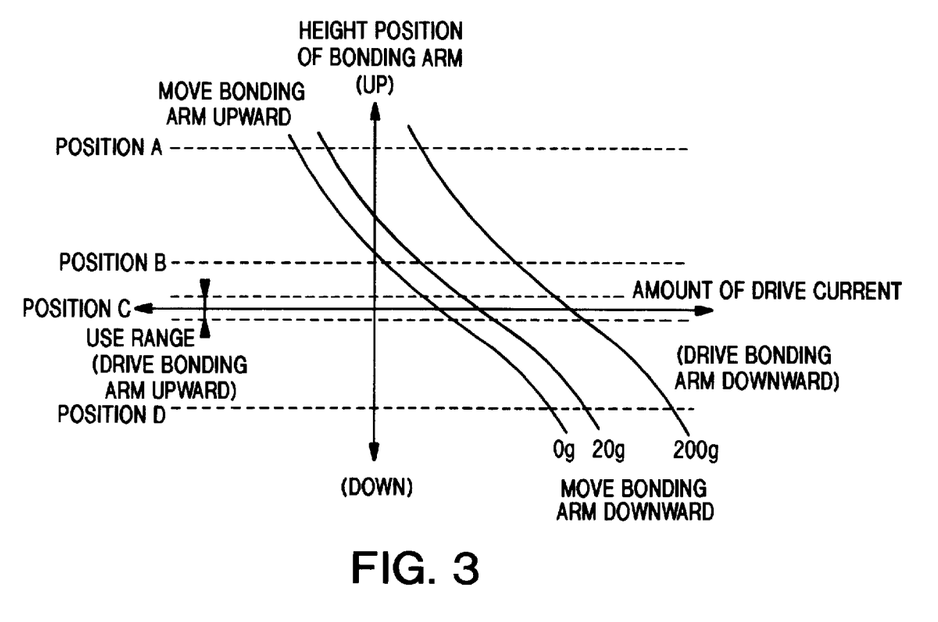
FIG. 3 is a graph showing the relationship between the height position of the bonding arm and the driving current.

If the results shown in FIG. 2 are substituted into the relationship between the height position of the bonding arm 2 and the driving current 35, the resulting curve is as shown for the case of no load (0 g) in FIG. 3. FIG. 3 further shows states in which respective bonding loads of 20 g and 200 g are applied to the bonding tool 1 in addition to the case of no load. FIG. 3 further shows how the driving current 35 varies in accordance to the variation of the height position of the bonding arm 2.

Components of the driving current 35 include: the standard current which is used to move the bonding arm 2 to the designated height position (i. e., the position command current), the correction current which compensates for the drop in the driving force caused by the lowering of the magnetic flux density due to the height position (i. e., the driving correction current), the correction current for the height position resulting from the spring load of the plate spring 4 (i. e., the spring load correction current), and the actual load current. The basic current obtained by adding the position command current, driving correction current and spring load correction current constitutes the driving current 35 in the case of no load. Furthermore, the current obtained by adding the actual load current to this basic current constitutes the driving current 35 in the case of actual loading.

In position A, the driving force drops as a result of a decrease of the magnetic flux density, and the spring load is generated in a direction which causes the bonding arm 2 to move downward. Accordingly, the correction current includes a driving correction current and a spring load correction current; and this driving correction current flows in a direction which drives the bonding arm 2 upward. Furthermore, the spring load correction current in this case also flows in a direction which drives the bonding arm 2 upward.

In position B, the driving force drops as a result of a decrease of the magnetic flux density; however, no spring load is generated. Accordingly, the correction current in this case consists only of a driving correction current; and this driving correction current flows in a direction which drives the bonding arm 2 upward.

In position C, there is no drop in the magnetic flux density; however, the spring load is generated in a direction which causes the bonding arm 2 to move upward. Accordingly, the correction current in this case consists only of a spring load correction current; and this spring load correction current flows in a direction which drives the bonding arm 2 downward.

In position D, the driving force drops as a result of a decrease of the magnetic flux density, and the spring load is generated in a direction which causes the bonding arm 2 to move upward. Accordingly, the correction current includes a driving correction current and a spring load correction current; and this driving correction current flows in a direction which drives the bonding arm 2 downward. Furthermore, the spring load correction current in this case flows in a direction which drives the bonding arm 2 downward.

The current directions described above are defined as shown in Table 1, where "+" is the direction that causes the bonding arm 2 to move upward, and "−" is the direction that causes the bonding arm 2 to move downward.

TABLE 1

| Position | Position Command Current | Driving Correction Current | Spring Load Correction Current | Actual Load Current |
| --- | --- | --- | --- | --- |
| A | + | + | + | − |
| B | + | + | 0 | − |
| C | 0 | 0 | − | − |
| D | − | − | − | − |

As seen from the above, in the present invention, the driving force of the plate spring is determined from the relationship between the amount of current flowing to a linear motor and the height position of the bonding arm, and the current flowing to the linear motor is controlled so that a correction is made for this driving force. Accordingly, an actual bonding load which is equal to the set bonding load can be obtained regardless of the height position of the bonding point.

What is claimed is:

1. A wire bonding apparatus comprising: a bonding arm which has a bonding tool at one end thereof and is supported by a plate spring so as to swing upward and downward, a linear motor which drives said bonding arm in a swinging motion, a position sensor which detects a position of said bonding arm in a vertical direction, a computer which processes signals from said position sensor and calculates a height position of said bonding arm and a limit value of a driving current that flows through said linear motor, a position control circuit which controls maintenance of a height position or a movement of said bonding arm in accordance with commands from said computer, a motor driver which generates a driving current in accordance with commands from said position control circuit and has a current limiter function that limits an amount of driving current in accordance with commands from said computer, and an external input-output means which inputs instructions into said computer and outputs results from said computer, wherein said bonding apparatus is characterized in that said computer is provided with a memory which stores a correction current value that corrects a driving force of said plate spring at said height position of said bonding arm, and said limit value of said driving current according to a bonding load.

2. A bonding load correction method for a wire bonding apparatus which comprises: a bonding arm which has a bonding tool at one end thereof and is supported by a plate spring so as to swing upward and downward, a linear motor which drives said bonding arm in a swinging motion, a position sensor which detects a position of said bonding arm in a vertical direction, a computer which processes signals from said position sensor and calculates a height position of said bonding arm and a limit value of a driving current that flows through said linear motor, a position control circuit which controls maintenance of a height position or a movement of said bonding arm in accordance with commands from said computer, a motor driver which generates a driving current in accordance with commands from said position control circuit and has a current limiter function that limits an amount of driving current in accordance with commands from said computer, and an external input-output means which inputs instructions into said computer and outputs results from said computer, wherein said method comprises the steps of determining a driving force of said plate spring from a relationship between an amount of current flowing through said linear motor and a height position of said bonding arm, and then controlling a current flowing through said linear motor so as to correct said driving force.

* * * * *